United States Patent
Lo et al.

(10) Patent No.: US 9,325,351 B2
(45) Date of Patent: Apr. 26, 2016

(54) ADAPTIVE MULTI-CORE, MULTI-DIRECTION TURBO DECODER AND RELATED DECODING METHOD THEREOF

(71) Applicant: MediaTek Singapore Pte. Ltd., Singapore (SG)

(72) Inventors: Chiaming Lo, Tustin, CA (US); Lawrence Chen Lee, Miaoli County (TW)

(73) Assignee: MediaTek Singapore Pte. Ltd., Singapore (SG)

( * ) Notice: Subject to any disclaimer, the term of this patent is extended or adjusted under 35 U.S.C. 154(b) by 143 days.

(21) Appl. No.: 13/798,109

(22) Filed: Mar. 13, 2013

(65) Prior Publication Data
US 2014/0281789 A1  Sep. 18, 2014

(51) Int. Cl.
H03M 13/29 (2006.01)
H03M 13/39 (2006.01)
H03M 13/00 (2006.01)

(52) U.S. Cl.
CPC ...... *H03M 13/2957* (2013.01); *H03M 13/3905* (2013.01); *H03M 13/395* (2013.01); *H03M 13/3972* (2013.01); *H03M 13/6525* (2013.01)

(58) Field of Classification Search
CPC ... H04L 1/0009; H04L 1/0057; H04L 1/0041; H04L 1/0071; H03M 13/35; H03M 13/116; H03M 13/1111; H03M 13/1137; H03M 13/6525; H03M 13/3972; H03M 13/395; H03M 13/3905; H03M 13/2857

USPC .......................... 714/752, 774; 375/340, 341
See application file for complete search history.

(56) References Cited

U.S. PATENT DOCUMENTS

| | | | |
|---|---|---|---|
| 6,813,743 B1 * | 11/2004 | Eidson .............. | H03M 13/3972 375/341 |
| 2002/0029362 A1 * | 3/2002 | Stephen et al. ................ | 714/752 |
| 2010/0268918 A1 * | 10/2010 | Priewasser et al. ........... | 712/208 |
| 2012/0066566 A1 | 3/2012 | Cui | |
| 2012/0204081 A1 * | 8/2012 | Fresia ................. | H03M 13/296 714/763 |
| 2012/0281790 A1 * | 11/2012 | Sokolov et al. ............... | 375/341 |

FOREIGN PATENT DOCUMENTS

WO  WO 2011/023782 A1 *  3/2011  ................ H04L 1/00

OTHER PUBLICATIONS

Sadjadpour, H.R., "Maximum A Posteriori Decoding Algorithms for Turbo Codes", Proc. SPIE 4045, Digital Wireless Communication II, pp. 73-83 (Jul. 26, 2000).*

* cited by examiner

*Primary Examiner* — Albert Decady
*Assistant Examiner* — Kyle Vallecillo
(74) *Attorney, Agent, or Firm* — Winston Hsu; Scott Margo

(57) ABSTRACT

A turbo decoder includes a plurality of decoder cores arranged for parallel decoding of a plurality of code segments of a code block in an iteration. Each of the decoder cores is arranged to decode a corresponding code segment according to a sliding window having a window size smaller than a length of the corresponding code segment in most cases, and sequentially generate a plurality of decoded soft outputs each derived from decoding an encoded soft input selected from the corresponding code segment by the sliding window.

18 Claims, 9 Drawing Sheets

ADAPTIVE MULTI-CORE, MULTI-DIRECTION TURBO DECODER AND RELATED DECODING METHOD THEREOF

BACKGROUND

The disclosed embodiments of the present invention relate to a turbo decoder design, and more particularly, to an adaptive multi-core, multi-direction turbo decoder and related decoding method thereof.

Data signals, in particular those transmitted over a typically hostile channel, are susceptible to channel noise/interference. Various methods of error correction coding have been developed in order to minimize the adverse effects that a hostile channel has on the integrity of the transmitted data. This is also referred to as lowering the bit error rate (BER), which is generally defined as the ratio of incorrectly received information bits to the total number of received information bits. Error correction coding generally involves representing digital data in ways designed to be robust with respect to error bits. Hence, error correction coding may enable a communications system to recover original data from a signal that has been corrupted due to the undesired channel noise/interference. For example, turbo codes may be used in the communications system, such as a Wideband Code Division Multiple Access (WCDMA) system and a Long Term Evolution (LTE) system, for channel coding.

Regarding any LTE system, it is desirable to find a way to support high data throughput. One conventional design is to use multiple turbo decoders, each having a single maximum a-posteriori probability (MAP) core. It is a straightforward method to increase the throughput but is out of date. Besides, multiple single-core turbo decoders will increase the cost by additional overhead and complicate the whole system design.

Another conventional design is to use a single turbo decoder with multiple MAP cores, each operating on a portion of the target code block. However, all of the MAP cores operate in the same decoding direction for computing forward/backward metrics will slow down the memory passing rate to affect performance and power consumption of the turbo decoder. Thus, there is a need for a turbo decoder with multiple MAP cores and multiple decoding operations for both performance and cost efficiency.

SUMMARY

In accordance with exemplary embodiments of the present invention, an adaptive multi-core, multi-direction turbo decoder and related decoding method thereof are proposed to solve the above-mentioned problem.

According to a first aspect of the present invention, an exemplary turbo decoder is disclosed. The exemplary turbo decoder includes at least one decoder core, each arranged to decode a corresponding code segment according to a sliding window having a window size smaller than a length of the corresponding code segment, and sequentially generate a plurality of decoded soft outputs each derived from decoding an encoded soft input selected from the corresponding code segment by the sliding window.

According to a second aspect of the present invention, an exemplary decoding method is disclosed. The exemplary decoding method includes following steps: enabling at least one decoder core in a turbo decoder; and configuring each of the at least one decoder core to decode a corresponding code segment according to a sliding window having a window size smaller than a length of the corresponding code segment in most cases, and sequentially generate a plurality of decoded soft outputs each derived from decoding an encoded soft input selected from the corresponding code segment by the sliding window.

According to a third aspect of the present invention, an exemplary turbo decoder is disclosed. The exemplary turbo decoder includes a plurality of pre-defined decoder cores and a controller. The controller is arranged for referring to a throughput requirement to adaptively enable part or all of the pre-defined decoder cores to decode a code block in an iteration.

According to a fourth aspect of the present invention, an exemplary decoding method is disclosed. The exemplary decoding method includes: providing a plurality of pre-defined decoder cores; and referring to a throughput requirement to adaptively enable part or all of the pre-defined decoder cores to decode a code block in an iteration.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
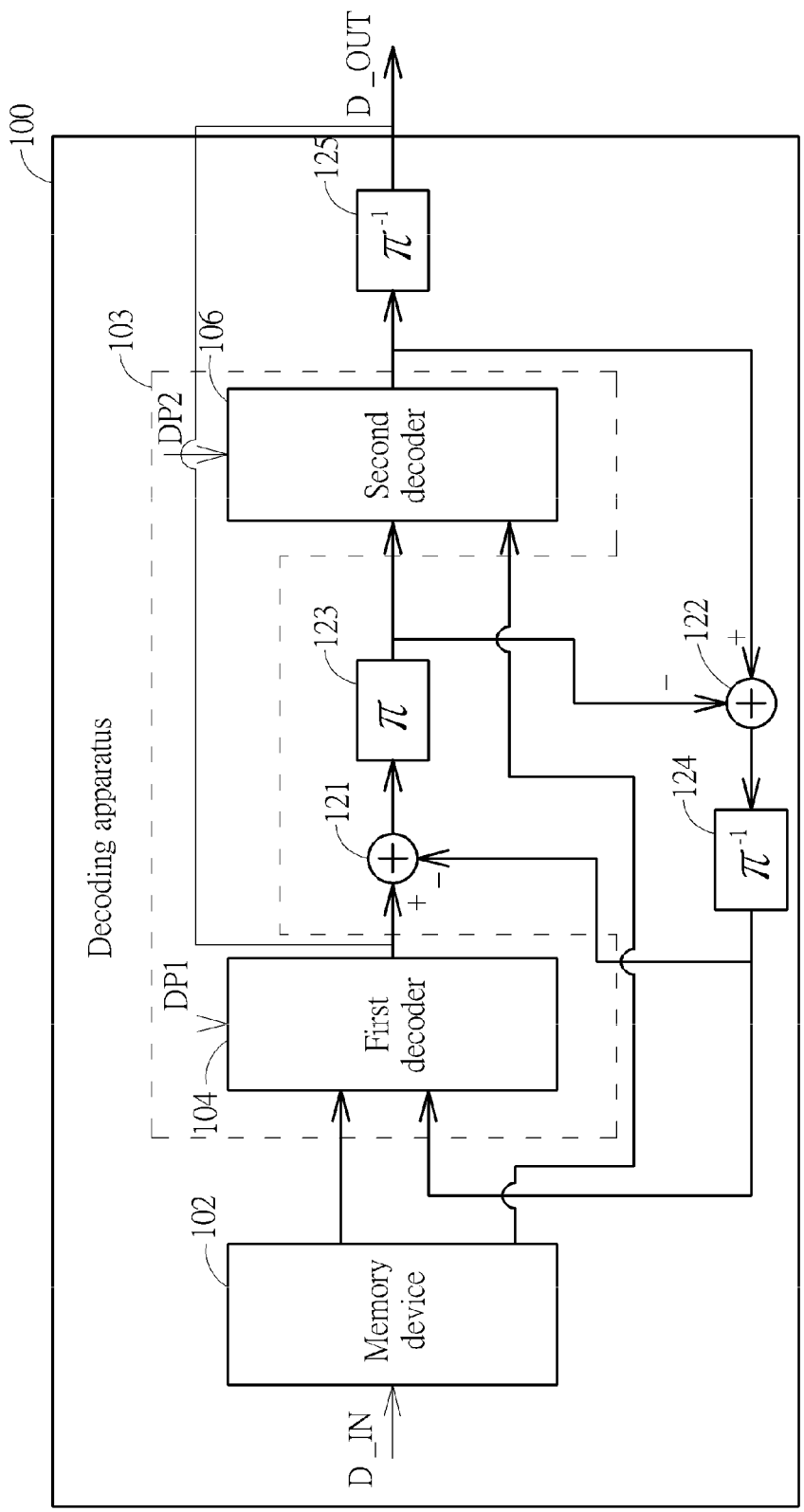
FIG. 1 is a block diagram illustrating a decoding apparatus according to an embodiment of the present invention.
Figure 2:
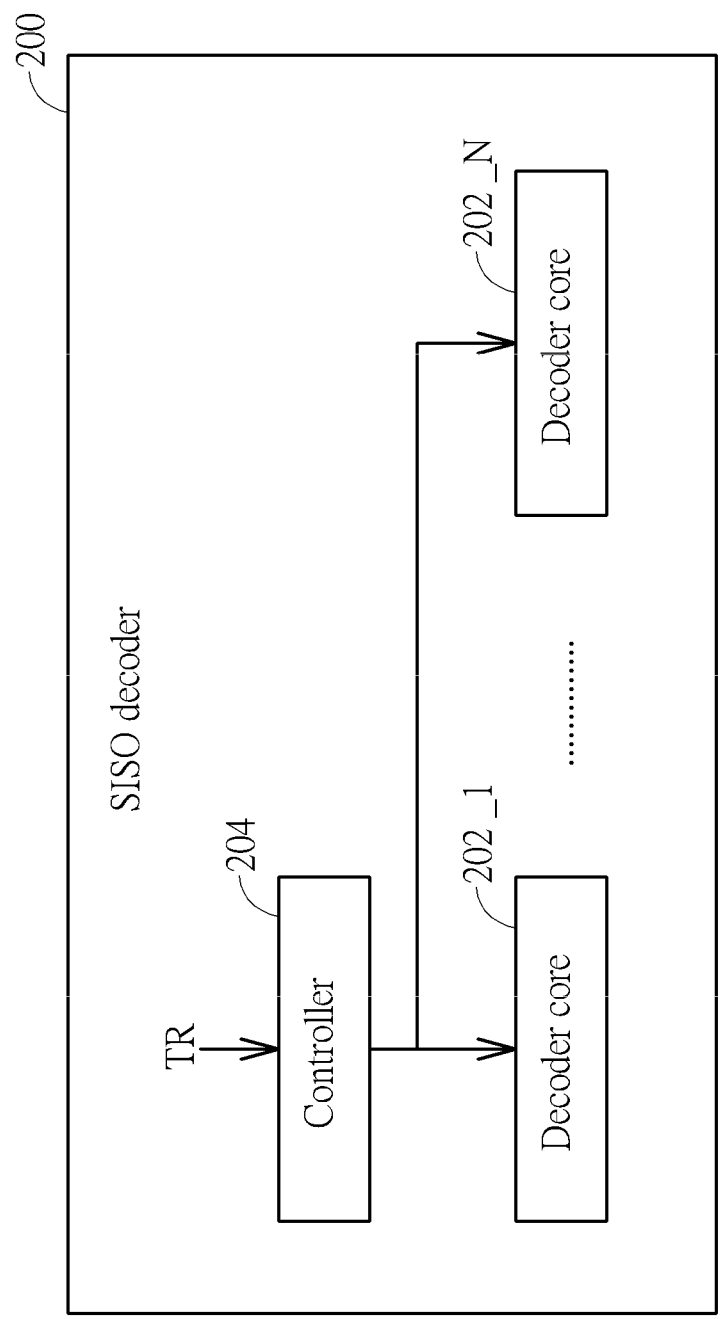
FIG. 2 is a block diagram illustrating a multi-core soft-in soft-out (SISO) decoder according to an embodiment of the present invention.

Please refer to FIG. 1 in conjunction with FIG. 2. FIG. 1 is a block diagram illustrating a decoding apparatus according to an embodiment of the present invention. FIG. 2 is a block diagram illustrating a multi-core soft-in soft-out (SISO) decoder according to an embodiment of the present invention. In one exemplary implementation, the exemplary decoding apparatus 100 may be a turbo decoding apparatus used for a communications system, such as a W-CDMA/HSPA 3G system or an LTE 4G system. However, this is for illustrative purposes only. In practice, any turbo decoder design employing the proposed techniques for achieving performance and cost efficiency falls within the scope of the present invention. As shown in FIG. 1, the decoding apparatus 100 includes a memory device 102 and a decoding circuit 103. In a logic sense, the decoding circuit 103 may be regarded as having a plurality of decoders (e.g., SISO decoders), including at least a first decoder 104 and a second decoder 106. In a physical sense, the decoding circuit 103 may employ a hardware sharing technique to make a single decoder with multiple decoder cores, as shown in FIG. 2, operate in a time-division manner. More specifically, when the decoding circuit 103 operates in a linear/sequential decoding phase, the single multi-core decoder (i.e., the SISO decoder 200 shown in FIG. 2) is operative to act as the first decoder 104; and when the decoding circuit 103 operates in an interleaved decoding phase, the same single multi-core decoder (i.e., the SISO decoder 200 shown in FIG. 2) is operative to act as the second decoder 106.

The memory device 102 in FIG. 1 serves as a systematic information memory. Hence, the memory device 102 is used to buffer a data block DIN composed of data bits (e.g., systematic bits). Each of the first decoder 104 (e.g., the single SISO decoder 200 operating in the linear/sequential decoding phase) and the second decoder 106 (e.g., the single SISO decoder 200 operating in the interleaved decoding phase) is a multi-core decoder capable of performing parallel decoding upon multiple codeword segments. Therefore, the SISO decoder 200 includes a plurality of pre-defined decoder cores (e.g., radix-4 MAP cores) 202_1-202_N, where the value of N may be the power of 2 (i.e., $N=2^n$). For example, the SISO decoder 200 may be configured to have four MAP cores. It should be noted that the number of pre-defined decoder cores implemented in the SISO decoder 200 may be adjusted, depending upon actual design requirement/consideration.

As the decoding apparatus 100 shown in FIG. 1 is a turbo decoding apparatus in this embodiment, there are arithmetic units 121, 122 used for getting extrinsic information. In addition, interleaver 123 and de-interleavers 124, 125 are also included in the decoding apparatus 100. By way of example, but not limitation, one of an output of the first decoder 104 and an output of the de-interleaver 125 may be selected as a decoded data block (i.e., a decoded code block) D_OUT composed of decoded data bits. Specifically, the output of the first decoder 104 is regarded as the turbo decoder output when the output of the first decoder 104 passes the parity check based on the first parity bits DP1, and the output of the de-interleaver 125 is regarded as the turbo decoder output when an output of the second decoder 106 passes the parity check based on the second parity bits DP2.

Each full iteration includes two half iterations, one using normal data and the other using interleaved data. That is, when the SISO decoder 200 is controlled to act as the first decoder 104, an even half iteration (i.e., half iteration 0, half iteration 2, half iteration 4, etc.) is performed by the SISO decoder 200, and when the SISO decoder 200 is controlled to act as the second decoder 104, an odd half iteration (i.e., half iteration 1, half iteration 3, half iteration 5, etc.) is performed by the SISO decoder 200. For an even half iteration, the soft decisions (soft bits) corresponding to systematic bits and the soft decisions (soft bits) corresponding to first parity bits DP1 are used by the first decoder 104 in order to decode a first constituent code. If the first decoder cannot decode correct, the first decoder 104 outputs the Log Likelihood Ratios (LLRs) of the transmitted bits, and they are used to help the decoding performed by the second decoder 106 in the following odd half iteration. However, they cannot be used directly and need to be processed so that they are in a format suitable to be fed into the second decoder 106. First, extrinsic values are obtained at the arithmetic 121 and then interleaved at the interleaver 123, in order to replicate the interleaving applied at the transmitter end on the sequence of bits to be encoded. The decoding performed by the second decoder 106 uses the extrinsic information generated by first decoder 104 with the soft decisions (soft bits) corresponding to interleaved systematic bits and the soft decisions (soft bits) corresponding to the second parity bits DP2. At the output of the second decoder 106, a new sequence of LLRs is generated for the sequence of transmitted bits. The LLRs are used by the arithmetic unit 122 to calculate the extrinsic information generated by the second decoder 106. After de-interleaving at the de-interleaver 124, this extrinsic information can be used, in a subsequent even half iteration, by the first decoder 104. To put it simply, the SISO decoder 200 is used to decode the non-interleaved data in even half iterations and decode the interleaved data in odd half iterations.

As shown in FIG. 2, the single SISO decoder 200 further includes a controller 204 arranged for referring to a throughput requirement TR to adaptively enable part or all of the pre-defined decoder cores 202_1-202_N (e.g., radix-4 MAP cores) to decode a code block in an iteration. For example, the SISO decoder 200 has four MAP cores. In a first case where the throughput requirement TR indicates that an application (e.g., a W-CDMA/HSPA/LTE system) which employs the exemplary decoding apparatus 100 is operating under a lower throughput condition, the controller 204 may enable one of the four MAP cores and leave remaining MAP cores disabled. In a second case where the throughput requirement TR indicates that an application (e.g., a W-CDMA/HSPA/LTE system) which employs the exemplary decoding apparatus 100 is operating under a middle throughput condition, the controller 204 may enable two of the four MAP cores and leave remaining MAP cores disabled. In a third case where the throughput requirement TR indicates that an application (e.g., a W-CDMA/HSPA/LTE system) which employs the exemplary decoding apparatus 100 is operating under a higher throughput condition, the controller 204 may enable all of the four MAP cores. To put it simply, a turbo decoder employing an adaptive multi-core partition scheme based on the throughput is capable of optimizing the turbo decoding operation over power and performance.

Each of the decoder cores 202_1-202_N may employ a sliding window based turbo decoding operation for reducing the memory requirement for buffering forward/backward metrics. For example, considering a single multi-core turbo decoder with 4 radix-4 MAP cores operating under a condition where the sliding window size is 64, the number of states is 8, and the bit width is 10, the memory size needed for buffering the forward/backward metrics may be expressed as $4*(1/2)*64*8*10=10$ kb. Hence, the production cost can be greatly reduced due to a smaller metric memory used.

Besides, when at least two of the decoder cores 202_1-202_N are simultaneously enabled for parallel decoding of different code segments of the same code block, a multi-direction decoding scheme may be employed to collaborate with the sliding window based turbo decoding operation for achieving near full-trace manner in both forward direction and backward direction. Further details of the sliding window based turbo decoding operation and the multi-direction decoding scheme are described as below.

In accordance with the sliding window based turbo decoding operation proposed in the present invention, each of the decoder cores 202_1-202_N is arranged to decode a corresponding code segment according to a sliding window having a window size smaller than a length of the corresponding code segment in most cases, and sequentially generate a plurality of decoded soft outputs each derived from decoding an encoded soft input selected from the corresponding code segment by the sliding window. The corresponding code segment processed by one decoder core may be part or all of a code block to be decoded by the SISO decoder 200. For example, when only one of the decoder cores 202_1-202_N is enabled by the controller 204, the corresponding code segment mentioned above is the whole code block. For another example, when at least two of the decoder cores 202_1-202_N are enabled by the controller 204, the corresponding code segment mentioned above is part of a code block.

Taking the LTE system for example, the size K of any data block (e.g., code block) composed of data bits (e.g., soft decisions/soft bits corresponding to systematic bits) is an integer multiple of 8. For example, when K>=512, K is an integer multiple of 16; when K>=1024, K is an integer multiple of 32; and when K>=2028, K is an integer multiple of 64. In this embodiment, the sliding window WS is designed to have a window size equal to 64. Please refer to FIG. 3, which is a diagram illustrating a code segmentation arrangement and a full-trace decoding direction arrangement for a code block when a single decoder core is enabled. As only one of the decoder cores 202_1-202_N is enabled, the single decoder core denoted by "Core 1" is required to decode all data bits of a code block CB. Thus, the size of a corresponding code segment CS1 to be processed by the single decoder core Core 1 is identical to the size of one code block CB. In a first iteration Iter_1, the single decoder core Core 1 obtain first metrics of the corresponding code segment CS1 in a first decoding direction D1 according to a full trace manner. In the present invention, the full trace manner means the state metric propagation is continuous over one half iteration. Therefore, the sliding window WS moves in the first decoding direction D1 until all of the data bits of the code segment CS1 (i.e., the code block CB) are decoded. It is possible that the size of the code block CB is not an integer multiple of the window size of the sliding window WS. Thus, when the sliding window WS moves to the end of the code segment CS1 (i.e., the code block CB), a fractional part Frac is selected by the sliding window WS. However, in a case where the size of the code block CB is an integer multiple of the window size of the sliding window WS, no fractional part Frac would be selected by the sliding window WS when the sliding window WS moves to the end of the code segment CS1 (i.e., the code block CB).

Figure 3:
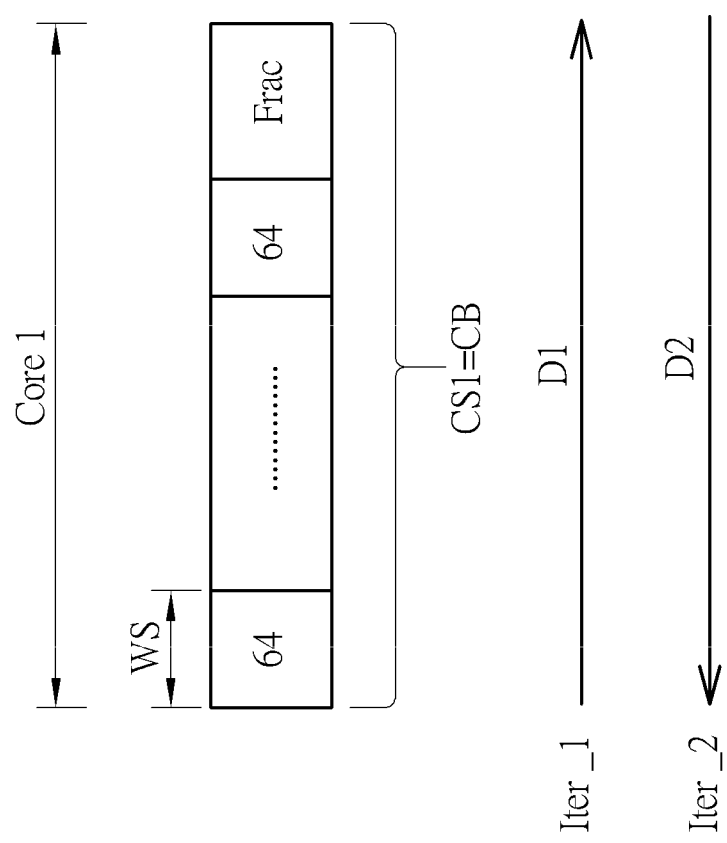
FIG. 3 is a diagram illustrating a code segmentation arrangement and a full-trace decoding direction arrangement for a code block when a single decoder core is enabled.

In a second iteration Iter_2, the single decoder core Core 1 obtain second metrics of the corresponding code segment CS1 in a second decoding direction D2 according to a full trace manner, where the second decoding direction D2 is opposite to the first decoding direction D2. Therefore, the sliding window WS moves in the second decoding direction D2 until all of the data bits of the code segment CS1 (i.e., the code block CB) are decoded. In a case where the size of the code block CB is not an integer multiple of the window size of the sliding window WS, the aforementioned fractional part Frac can be initially selected by the sliding window WS, as shown in FIG. 3. Alternatively, in the second iteration Iter_2, the aforementioned fractional part Frac can be handled at the end of the code segment, which also belongs to the scope of the present invention. In another case where the size of the code block CB is an integer multiple of the window size of the sliding window WS, no fractional part Frac would be initially selected by the sliding window WS.

Figure 4:
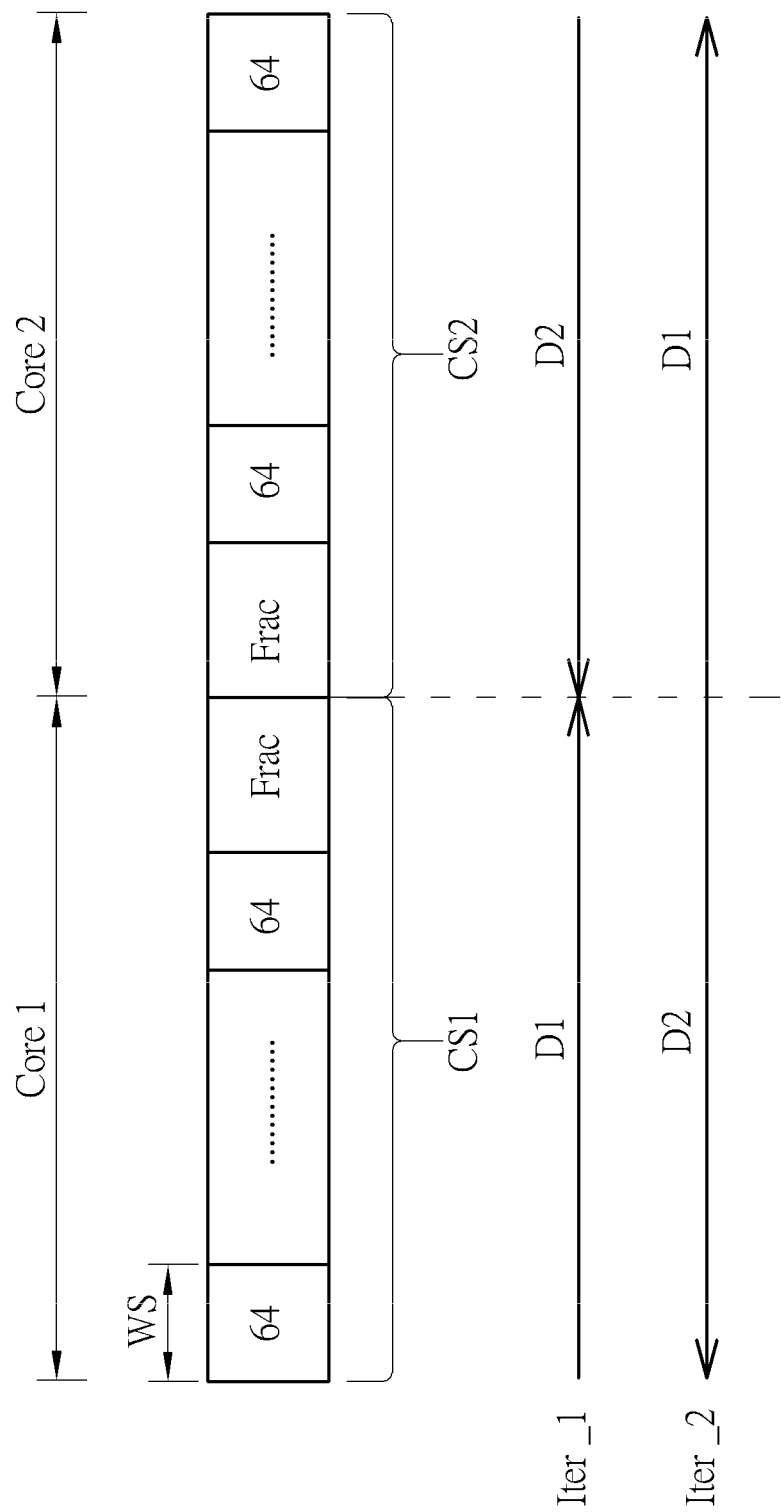
FIG. 4 is a diagram illustrating a code segmentation arrangement and a full-trace decoding direction arrangement for a code block when two decoder cores are enabled.

Please refer to FIG. 4, which is a diagram illustrating a code segmentation arrangement and a full-trace decoding direction arrangement for a code block when two decoder cores are enabled. As two of the decoder cores 202_1-202_N are simultaneously enabled, the decoder cores denoted by "Core 1" and "Core 2" are required to decode data bits included in respective code segments CS1 and CS2 of a code block CB, where code segments CS1 and CS2 have the same size in most cases (i.e., CS1=CS2 & CS1+CS2=CB). In a first iteration Iter_1, the decoder core Core 1 obtain first metrics of the corresponding code segment CS1 in a first decoding direction D1 according to a full trace manner, and the decoder core Core 2 obtain second metrics of the corresponding code segment CS2 in a second decoding direction D2 according to a full trace manner. In a second iteration Iter_2, the decoder core Core 1 obtain second metrics of the corresponding code segment CS1 in the second decoding direction D2 according to a full trace manner, and the decoder core Core 2 obtain first metrics of the corresponding code segment CS2 in the first decoding direction D1 according to a full trace manner.

Figure 5:
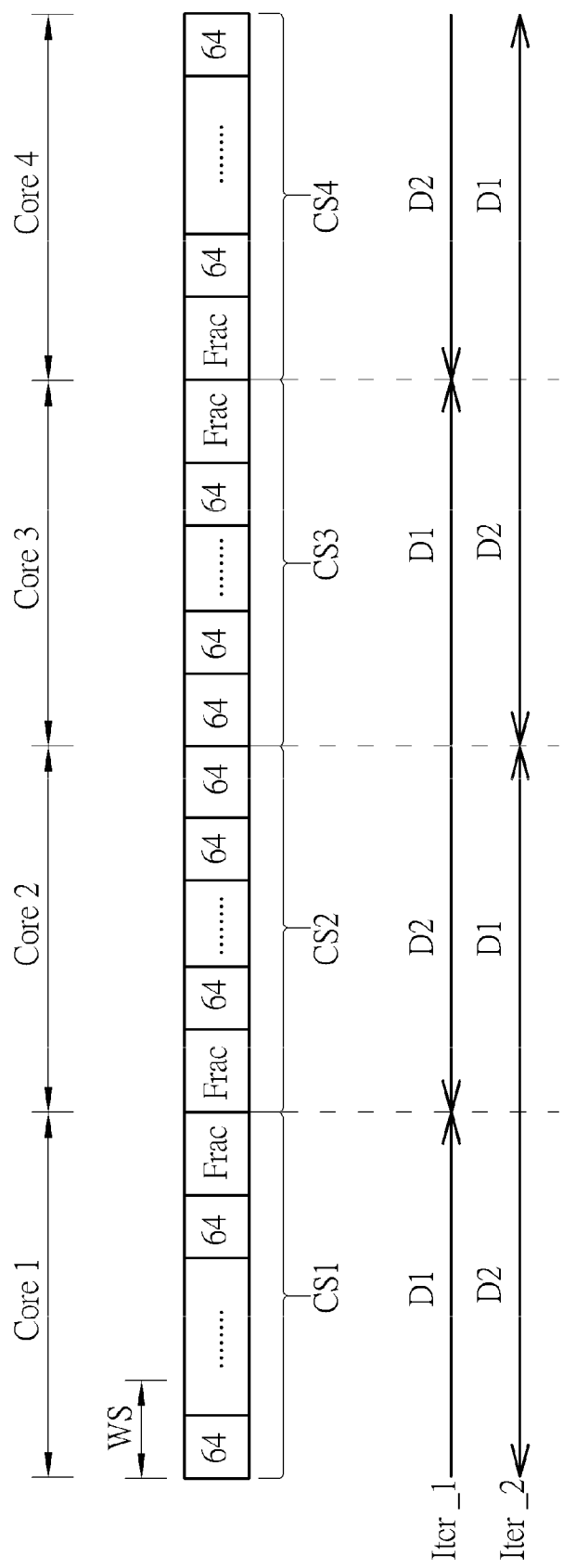
FIG. 5 is a diagram illustrating a code segmentation arrangement and a full-trace decoding direction arrangement for a code block when four decoder cores are enabled.

Please refer to FIG. 5, which is a diagram illustrating a code segmentation arrangement and a full-trace decoding direction arrangement for a code block when four decoder cores are enabled. As all of the decoder cores 202_1-202_N are simultaneously enabled (in this example, N=4), the decoder cores denoted by "Core 1", "Core 2", "Core 3" and "Core 4" are required to decode data bits included in respective code segments CS1, CS2, CS3 and CS4 of a code block CB, where code segments CS1-CS4 have the same size in most cases (i.e., CS1=CS2=CS3=CS4 & CS1+CS2+CS3+CS4=CB). In a first iteration Iter_1, the decoder core Core 1 obtain first metrics of the corresponding code segment CS1 in a first decoding direction D1 according to a full trace manner, the decoder core Core 2 obtain second metrics of the corresponding code segment CS2 in a second decoding direction D2 according to a full trace manner, the decoder core Core 3 obtain first metrics of the corresponding code segment CS3 in the first decoding direction D1 according to a full trace manner, and the decoder core Core 4 obtain second metrics of the corresponding code segment CS4 in the second decoding direction D2 according to a full trace manner. In a second iteration Iter_2, the decoder core Core 1 obtain second metrics of the corresponding code segment CS1 in the second decoding direction D2 according to a full trace manner, the decoder core Core 2 obtain first metrics of the corresponding code segment CS2 in the first decoding direction D1 according to a full trace manner, the decoder core Core 3 obtain second metrics of the corresponding code segment CS3 in the second decoding direction D2 according to a full trace manner, and the decoder core Core 4 obtain first metrics of the corresponding code segment CS4 in the first decoding direction D1 according to a full trace manner.

In a first scenario, the first iteration Iter_1 is an odd half iteration (e.g., half iteration 1), the second iteration Iter_2 is an even half iteration (e.g., half iteration 2) following the odd half iteration, the first decoding direction D1 is a forward direction, the second decoding direction D2 is a backward direction, the first metrics are forward metrics, and the second metrics are backward metrics. Alternatively, the second iteration Iter_2 may be an odd half iteration (e.g., half iteration 1), and the first iteration Iter_1 may be an even half iteration (e.g., half iteration 2) following the odd half iteration.

In a second scenario, the first iteration Iter_1 is an even half iteration (e.g., half iteration 0), the second iteration Iter_2 is an odd half iteration (e.g., half iteration 1) following the even half iteration, the first decoding direction D1 is a forward direction, the second decoding direction D2 is a backward direction, the first metrics are forward metrics, and the second metrics are backward metrics. Alternatively, the second iteration Iter_2 may be an even half iteration (e.g., half iteration 0), and the first iteration Iter_1 may be an odd half iteration (e.g., half iteration 1) following the even half iteration.

In a third scenario, the first iteration Iter_1 is an odd half iteration (e.g., half iteration 1), the second iteration Iter_2 is the next odd half iteration (e.g., half iteration 3), the first decoding direction D1 is a forward direction, the second decoding direction D2 is a backward direction, the first metrics are forward metrics, and the second metrics are backward metrics. Alternatively, the second iteration Iter_2 may be an odd half iteration (e.g., half iteration 1), and the first iteration Iter_1 may be the next odd half iteration (e.g., half iteration 3).

In a fourth scenario, the first iteration Iter_1 is an even half iteration (e.g., half iteration 0), the second iteration Iter_2 is the next even half iteration (e.g., half iteration 2), the first decoding direction D1 is a forward direction, the second decoding direction D2 is a backward direction, the first metrics are forward metrics, and the second metrics are backward metrics. Alternatively, the second iteration Iter_2 may be an even half iteration (e.g., half iteration 0), and the first iteration Iter_1 may be the next even half iteration (e.g., half iteration 2).

In FIG. 3-FIG. 5, only the full-trace direction of computing the forward/backward metrics is shown. Actually, regarding the sliding window based turbo decoding operation, each of the decoder cores 202_1-202_N is further arranged to compute forward/backward metrics of the corresponding code segment according to a partial trace manner. In the present invention, the partial trace manner means the state metric propagation is discontinuous over one half iteration.

Figure 6:
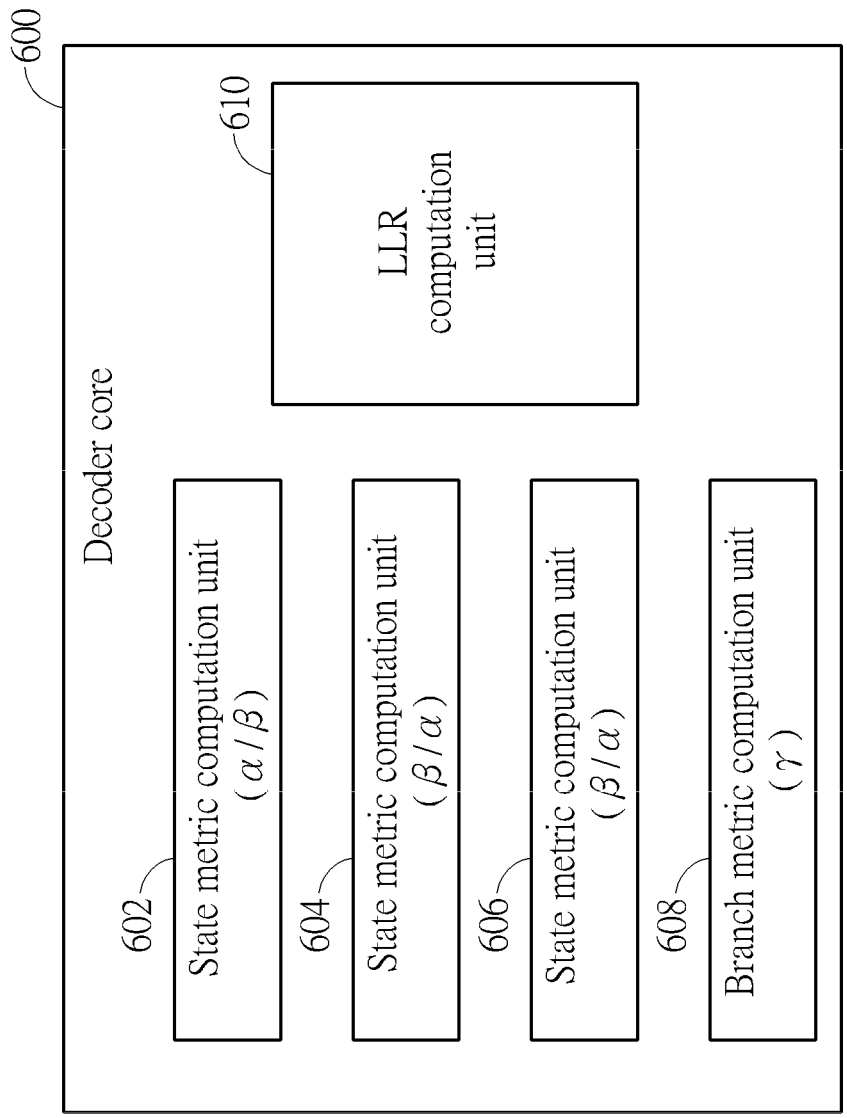
FIG. 6 is a block diagram illustrating an exemplary implementation of a decoder core according to an embodiment of the present invention.
Figure 7:
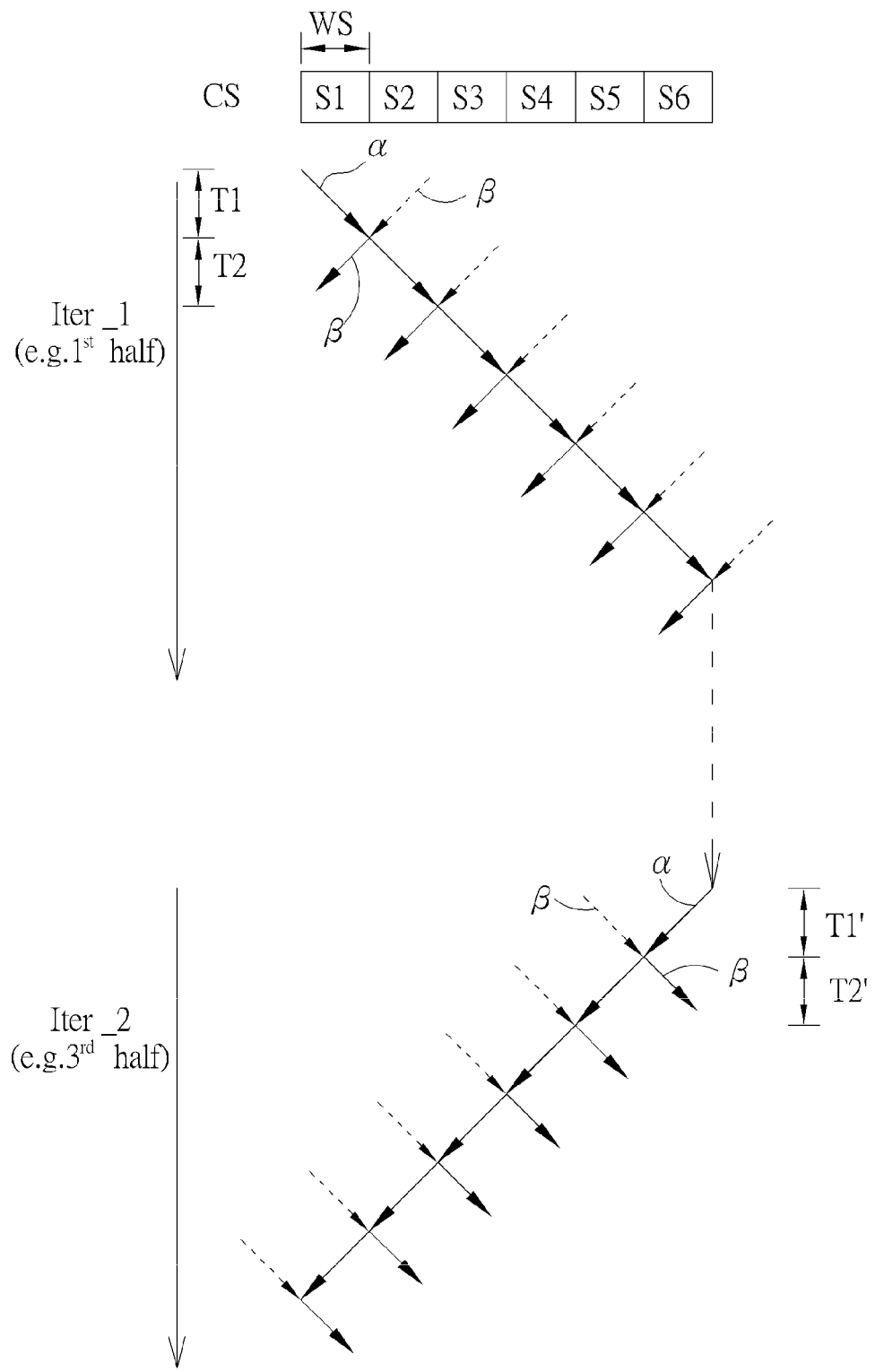
FIG. 7 is a diagram illustrating an exemplary turbo decoding operation performed by the decoder core shown in FIG. 6.

For better understanding of technical features of the present invention, please refer to FIG. 6 in conjunction with FIG. 7. FIG. 6 is a block diagram illustrating a decoder core according to an embodiment of the present invention. FIG. 7 is a diagram illustrating an exemplary turbo decoding operation performed by the decoder core shown in FIG. 6. Each of the decoder cores 202_1-202_N shown in FIG. 2 may be implemented using the exemplary decoder core 600 shown in FIG. 6. The decoder core 600 includes a plurality of state metric computation units (e.g., add-compare-select (ACS) units) 602, 604, 606, a branch metric computation unit 608, and an LLR computation unit 610. The branch metric computation unit 608 is arranged to compute transition metrics ($\gamma$) for the state metrics, including forward metrics and backward metrics, obtained by the 3 state metric computation units 602, 604, 606. Hence, when a forward/backward metric is obtained by one of the state metric computation units 602, 604, 606, the branch metric computation unit 608 is operative to compute a transition metric correspondingly. Regarding the LLR computation unit 610, it is arranged to compute a soft output according to forward metrics ($\alpha$), backward metrics ($\beta$) and transition metrics ($\gamma$). In this embodiment, when the state metric computation unit 602 is used to computer forward metrics ($\alpha$) in a full trace manner, the state metric computation unit 604/606 is used to computer backward metrics ($\beta$) in a partial trace manner; and when the state metric computation unit 602 is used to computer backward metrics ($\beta$) in a full trace manner, the state metric computation unit 604/606 is used to computer forward metrics ($\alpha$) in a partial trace manner.

Further details of the decoder core 600 are described with reference to FIG. 7. Suppose that the size of a code block is an integer multiple of the sliding window size (e.g., 64 bits). For example, a code segment to be processed by a decoder core has 64×6 bits. Thus, as shown in FIG. 7, the sliding window WS would sequentially selects encoded soft inputs S1-S6 of the corresponding code segment CS in the first decoding direction D1 when the code segment CS is decoded in the first iteration Iter_1 (e.g., odd half iteration 1 for code segment CS with interleaved data, or even half iteration 0 for code segment CS with non-interleaved data), and the sliding window WS would sequentially selects encoded soft inputs S6-S1 of the corresponding code segment CS in the second decoding direction D2 when the code segment CS is decoded in the second iteration Iter_2 (e.g., odd half iteration 3 for code segment CS with interleaved data, or even half iteration 2 for code segment CS with non-interleaved data) following the first iteration Iter_1. Besides, the state metric propagation is indicated by these arrow symbols. As can be readily seen from FIG. 7, the state metrics computed using a full trace manner would have a continuous state metric propagation, and the state metrics computed using a partial trace manner would have a discontinuous state metric propagation. Initially, during the time period T1, the state metric computation unit 602 computes forward metrics of the encoded soft input S1 currently selected by the sliding window WS according to a full trace manner, and the state metric computation unit 604 performs pre-training to compute backward metrics of the encoded soft input S2 according to a partial trace manner. Besides, the branch metric computation unit 608 computes a transition metric in response to each forward metric obtained by the state metric computation unit 602 during the time period T1, and further computes a transition metric in response to each backward metric obtained by the state metric computation unit 604 during the time period T1.

During the next time period T2, the state metric computation unit 602 computes forward metrics of the encoded soft input S2 currently selected by the sliding window WS according to a full trace manner, the state metric computation unit 604 performs pre-training to compute backward metrics of the encoded soft input S3 according to a partial trace manner, and the state metric computation unit 606 computes backward metrics of the encoded soft input S1 according to a partial trace manner. Besides, the branch metric computation unit 608 computes a transition metric in response to each forward metric obtained by the state metric computation unit 602 during the time period T2, and further computes a transition metric in response to each backward metric obtained by each of the state metric computation units 604 and 606 during the time period T2. Hence, the branch metric computation unit 608 would obtain all needed transition metrics of the encoded soft input S1 during the time period T2. As forward metrics, backward metrics and transition metrics of the encoded soft input S1 are available now, the LLR computation unit 610 is operative to refer to forward metrics, backward metrics and transition metrics of the encoded soft input S1 for generating a decoded soft output of the encoded soft input S1 during the time period T2. As the following decoding operation of remaining encoded soft inputs S2-S6 in the first iteration Iter_1 can be easily deduced by analogy, further description is omitted for brevity.

As shown in FIG. 7, the sliding window WS would sequentially selects encoded soft inputs S6-S1 of the corresponding code segment CS in the second decoding direction D2 when the code segment CS is decoded in the second iteration Iter_2. Initially, during the time period T1', the state metric computation unit 602 computes backward metrics of the encoded soft input S6 currently selected by the sliding window WS according to a full trace manner, and the state metric computation unit 604 performs pre-training to compute forward metrics of the encoded soft input S5 according to a partial trace manner. Besides, the branch metric computation unit 608 computes a transition metric in response to each backward metric obtained by the state metric computation unit 602 during the time period T1', and further computes a transition metric in response to each forward metric obtained by the state metric computation unit 604 during the time period T1'.

During the next time period T2', the state metric computation unit 602 computes backward metrics of the encoded soft input S5 currently selected by the sliding window WS according to a full trace manner, the state metric computation unit 604 performs pre-training to compute forward metrics of the encoded soft input S4 according to a partial trace manner, and the state metric computation unit 606 computes forward metrics of the encoded soft input S6 according to a partial trace manner. Besides, the branch metric computation unit 608 computes a transition metric in response to each backward metric obtained by the state metric computation unit 602 during the time period T2', and further computes a transition metric in response to each forward metric obtained by each of the state metric computation units 604 and 606 during the time period T2'. Hence, the branch metric computation unit 608 would obtain all needed transition metrics of the encoded soft input S6 during the time period T2'. As forward metrics, backward metrics and transition metrics of the encoded soft input S6 are available now, the LLR computation unit 610 is operative to refer to forward metrics, backward metrics and transition metrics of the encoded soft input S6 for generating an iteratively decoded soft output of the encoded soft input S6 during the time period T2'. As the following decoding operation of the remaining encoded soft inputs S5-S1 in the second iteration Iter_2 can be easily deduced by analogy, further description is omitted for brevity.

Figure 8:
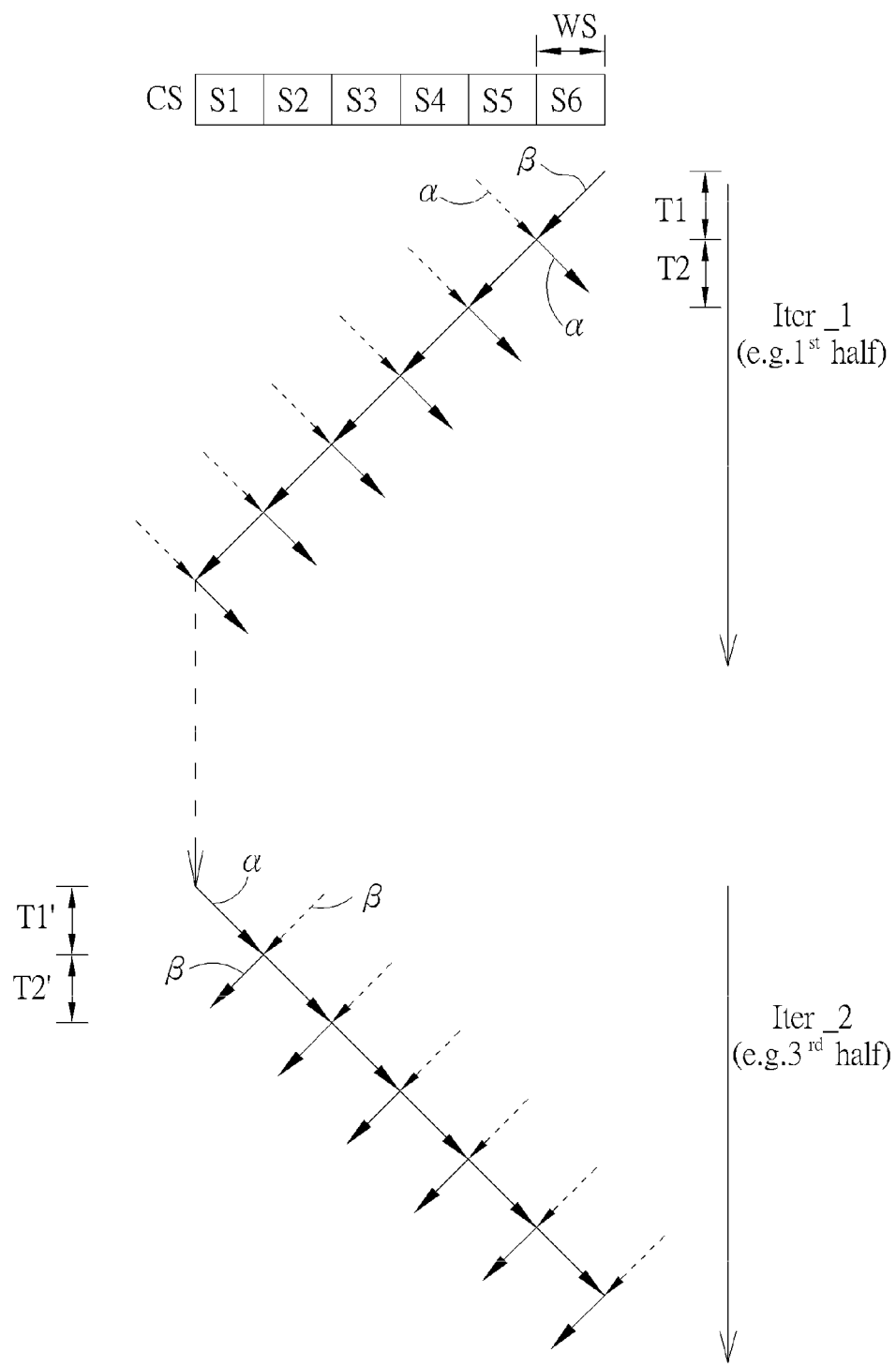
FIG. 8 is a diagram illustrating another exemplary turbo decoding operation performed by the decoder core shown in FIG. 6.

Please refer to FIG. 8, which is a diagram illustrating another exemplary turbo decoding operation performed by the decoder core 600 shown in FIG. 6. As shown in FIG. 8, the sliding window WS would sequentially selects encoded soft inputs S6-S1 of the corresponding code segment CS in the second decoding direction D2 when the code segment CS is decoded in the first iteration Iter_1 (e.g., odd half iteration 1 for code segment CS with interleaved data, or even half iteration 0 for code segment CS with non-interleaved data), and the sliding window WS would sequentially selects encoded soft inputs S1-S6 of the corresponding code segment CS in the first decoding direction D1 when the code segment CS is decoded in the second iteration Iter_2 (e.g., odd half iteration 3 for code segment CS with interleaved data, or even half iteration 2 for code segment CS with non-interleaved data) following the first iteration Iter_1. Besides, the state metric propagation is indicated by these arrow symbols. As can be readily seen from FIG. 8, the state metrics computed using a full trace manner would have a continuous state metric propagation, and the state metrics computed using a partial trace manner would have a discontinuous state metric propagation.

Initially, during the time period T1, the state metric computation unit 602 computes backward metrics of the encoded soft input S6 currently selected by the sliding window WS according to a full trace manner, and the state metric computation unit 604 performs pre-training to compute forward metrics of the encoded soft input S5 according to a partial trace manner. Besides, the branch metric computation unit 608 computes a transition metric in response to each backward metric obtained by the state metric computation unit 602 during the time period T1, and further computes a transition metric in response to each forward metric obtained by the state metric computation unit 604 during the time period T1.

During the next time period T2, the state metric computation unit 602 computes backward metrics of the encoded soft input S5 currently selected by the sliding window WS according to a full trace manner, the state metric computation unit 604 performs pre-training to compute forward metrics of the encoded soft input S4 according to a partial trace manner, and the state metric computation unit 606 computes forward metrics of the encoded soft input S6 according to a partial trace manner. Besides, the branch metric computation unit 608 computes a transition metric in response to each backward metric obtained by the state metric computation unit 602 during the time period T2, and further computes a transition metric in response to each forward metric obtained by each of the state metric computation units 604 and 606 during the time period T2. Hence, the branch metric computation unit 608 would obtain all needed transition metrics of the encoded soft input S6 during the time period T2. As forward metrics, backward metrics and transition metrics of the encoded soft input S6 are available now, the LLR computation unit 610 is operative to refer to forward metrics, backward metrics and transition metrics of the encoded soft input S6 for generating a decoded soft output of the encoded soft input S6 during the time period T2. As the following decoding operation of remaining encoded soft inputs S5-S1 in the first iteration Iter_1 can be easily deduced by analogy, further description is omitted for brevity.

As shown in FIG. 8, the sliding window WS would sequentially selects encoded soft inputs S1-S6 of the corresponding code segment CS in the first decoding direction D1 when the code segment CS is decoded in the second iteration Iter_2. Initially, during the time period T1', the state metric computation unit 602 computes forward metrics of the encoded soft input S1 currently selected by the sliding window WS according to a full trace manner, and the state metric computation unit 604 performs pre-training to compute backward metrics of the encoded soft input S2 according to a partial trace manner. Besides, the branch metric computation unit 608 computes a transition metric in response to each forward metric obtained by the state metric computation unit 602 during the time period T1', and further computes a transition metric in response to each backward metric obtained by the state metric computation unit 604 during the time period T1'.

During the next time period T2', the state metric computation unit 602 computes forward metrics of the encoded soft input S2 currently selected by the sliding window WS according to a full trace manner, the state metric computation unit 604 performs pre-training to compute backward metrics of the encoded soft input S3 according to a partial trace manner, and the state metric computation unit 606 computes backward metrics of the encoded soft input S1 according to a partial trace manner. Besides, the branch metric computation unit 608 computes a transition metric in response to each forward metric obtained by the state metric computation unit 602 during the time period T2', and further computes a transition metric in response to each backward metric obtained by each of the state metric computation units 604 and 606 during the time period T2'. Hence, the branch metric computation unit 608 would obtain all needed transition metrics of the encoded soft input S1 during the time period T2'. As forward metrics, backward metrics and transition metrics of the encoded soft input S1 are available now, the LLR computation unit 610 is operative to refer to forward metrics, backward metrics and transition metrics of the encoded soft input S1 for generating an iteratively decoded soft output of the encoded soft input S1 during the time period T2'. As the following decoding operation of remaining encoded soft inputs S2-S6 in the second iteration Iter_2 can be easily deduced by analogy, further description is omitted for brevity.

Regarding the sliding window based multi-direction decoding operation shown in FIG. 7, the forward metrics are computed using a full trace manner and the backward metrics are computed using a partial trace manner during the first iteration Iter_1, and the forward metrics are computed using a partial trace manner and the backward metrics are computed using a full trace manner during the second iteration Iter_2. Similarly, regarding the sliding window based multi-direction decoding operation shown in FIG. 8, the backward metrics are computed using a full trace manner and the forward metrics are computed using a partial trace manner during the first iteration Iter_1, and the backward metrics are computed using a partial trace manner and the forward metrics are computed using a full trace manner during the second iteration Iter_2. In either of these examples shown in FIG. 7 and FIG. 8, a near full-trace decoding operation of the code segment CS is achieved by the decoder core 600 for better decoding performance.

Figure 9:
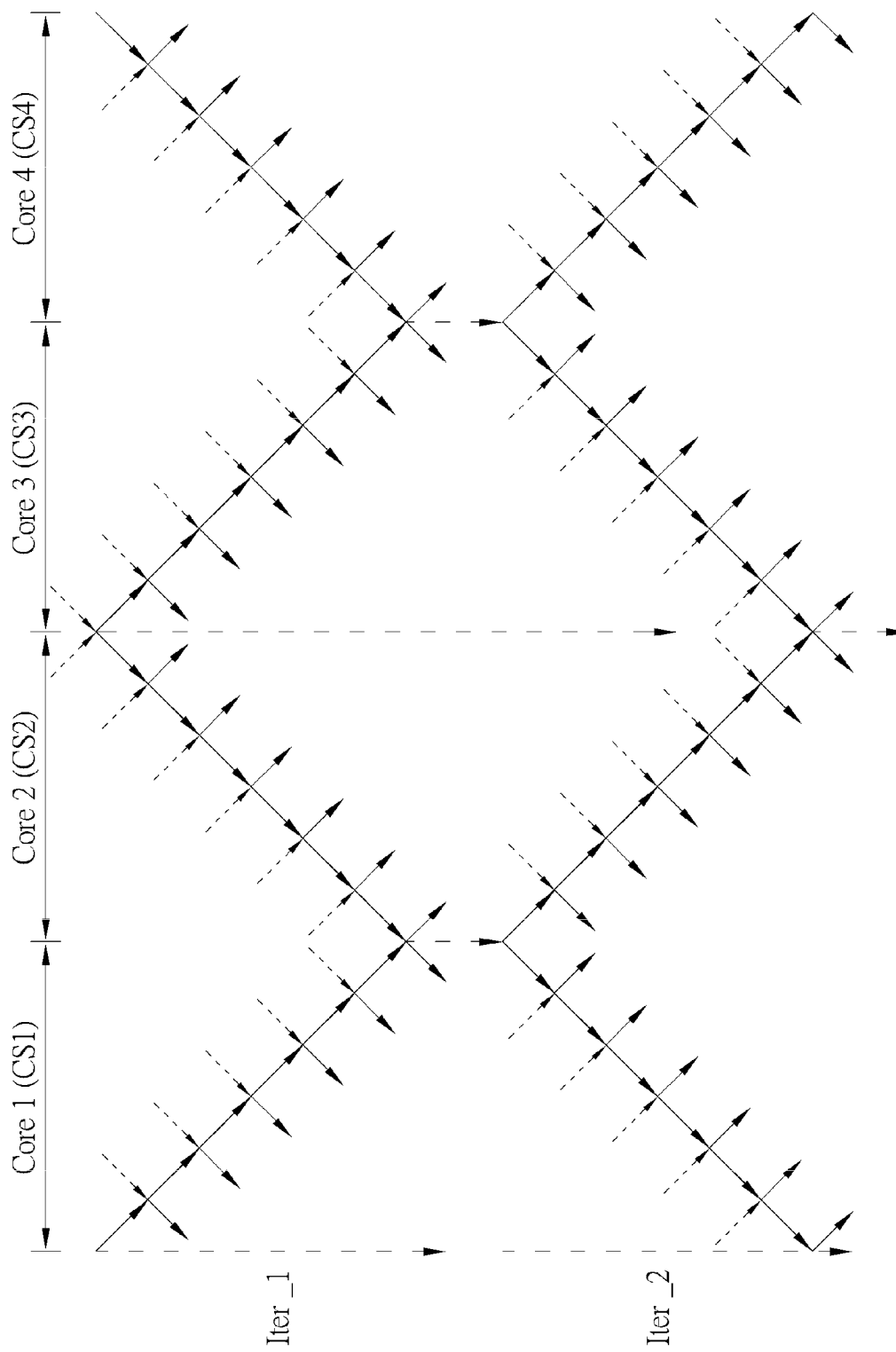
FIG. 9 is a diagram illustrating a sliding window based multi-direction decoding operation of a SISO decoder with four MAP cores enabled for parallel decoding.

Based on the sliding window based multi-direction decoding operations shown in FIG. 7 and FIG. 8 and the code segmentation arrangement and full-trace decoding direction arrangement shown in FIG. 5, a sliding window based multi-direction decoding operation of a SISO decoder with four MAP cores enabled for parallel decoding is shown in FIG. 9. Regarding the first iteration Iter_1 of decoding a code block composed of code segments CS1-CS4, the decoder core Core 1 is arranged to obtain forward metrics of a code segment CS1 in the first decoding direction (i.e., the forward direction) D1 according to a full trace manner, and obtain backward metrics of the code segment CS1 in the second decoding direction (i.e., the backward direction) D2 according to a partial trace manner; the decoder core Core 2 is arranged to obtain backward metrics of a next code segment CS2 in the second decoding direction D2 according to a full trace manner, and obtain forward metrics of the code segment CS2 in the first decoding direction D1 according to a partial trace manner; the decoder core Core 3 is arranged to obtain forward metrics of a next code segment CS3 in the first decoding direction D1 according to a full trace manner, and obtain backward metrics of the code segment CS3 in the second decoding direction D2 according to a partial trace manner; and the decoder core Core 4 is arranged to obtain backward metrics of a next code segment CS4 in the second decoding direction D2 according to a full trace manner, and obtain forward metrics of the code segment CS4 in the first decoding direction D1 according to a partial trace manner.

Regarding the second iteration Iter_2 of decoding the code block composed of code segments CS1-CS4, the decoder core Core 1 is arranged to obtain backward metrics of the code segment CS1 in the second decoding direction D2 according to a full trace manner, and obtain forward metrics of the code segment CS1 in the first decoding direction D1 according to a partial trace manner; the decoder core Core 2 is arranged to obtain forward metrics of the next code segment CS2 in the first decoding direction D1 according to a full trace manner, and obtain backward metrics of the code segment CS2 in the second decoding direction D2 according to a partial trace manner; the decoder core Core 3 is arranged to obtain backward metrics of the next code segment CS3 in the second decoding direction D2 according to a full trace manner, and obtain forward metrics of the code segment CS3 in the first decoding direction D1 according to a partial trace manner; and the decoder core Core 4 is arranged to obtain forward metrics of the next code segment CS4 in the second decoding direction D2 according to a full trace manner, and obtain backward metrics of the code segment CS4 in the second decoding direction D2 according to a partial trace manner.

As a person skilled in the art can readily understand principles of the sliding window based multi-direction decoding operation performed by each decoder core shown in FIG. 9 after reading above paragraphs, further description is omitted for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A turbo decoder comprising:
a plurality of decoder cores, each arranged to decode a different corresponding code segment according to a sliding window, and sequentially generate a plurality of decoded soft outputs each derived from decoding an encoded soft input selected from the corresponding code segment by the sliding window;
wherein in a same iteration, adjacent decoder cores of the plurality of decoder core cores are arranged to obtain different metrics in opposite decoding directions respectively, and in adjacent iterations, one of the plurality of decoder cores is arranged to obtain different metrics in opposite decoding directions.

2. The turbo decoder of claim 1, wherein the plurality of decoder cores are arranged for parallel decoding of a plurality of code segments of a code block in one iteration.

3. The turbo decoder of claim 1, wherein in a first iteration, a first decoder core of the plurality of decoder cores is arranged to obtain first metrics of a first code segment in a first decoding direction according to a full trace manner, and obtain second metrics of the first code segment in a second decoding direction according to a partial trace manner, where the second decoding direction is opposite to the first decoding direction.

4. The turbo decoder of claim 3, wherein in a second iteration following the first iteration, the first decoder core is arranged to obtain the first metrics of the first code segment in the first decoding direction according to the partial trace manner, and obtain the second metrics of the first code segment in the second decoding direction according to the full trace manner.

5. The turbo decoder of claim 3, wherein the first code segment and a second code segment are successive code segments in a code block; and in the first iteration, a second decoder core of the plurality of decoder cores is arranged to obtain first metrics of the second code segment in the first decoding direction according to a partial trace manner, and obtain second metrics of the second code segment in the second decoding direction according to the full trace manner.

6. The turbo decoder of claim 1, wherein the turbo decoder has a plurality of pre-defined decoder cores, and further comprises:
a controller, arranged for referring to a throughput requirement to adaptively enable part or all of the pre-defined decoder cores as the plurality of decoder cores for decoding a code block.

7. The turbo decoder of claim 1, wherein a first encoded soft input, a second encoded soft input and a third encoded soft input are successively selected from the corresponding code segment by the sliding window; and each decoder core comprises:
- a first metric computation unit, wherein during a first time period, the first metric computation unit is arranged for computing first metrics of the second encoded soft input in a first decoding direction according to a full trace manner; and
- a plurality of second metric computation units, wherein during the first time period, one of the second metric computation units is arranged for computing second metrics of the first encoded soft input in a second decoding direction opposite to the first decoding direction according to a partial trace manner, and another of the second metric computation units is arranged for computing second metrics of the third encoded soft input in the second decoding direction according to the partial trace manner.

8. The turbo decoder of claim 7, wherein during a second time period preceding the first time period, the first metric computation unit is further arranged for computing first metrics of the first encoded soft input in the first decoding direction according to the full trace manner; and each decoder core further comprises:
- a third metric computation unit, wherein during the first time period, the third metric computation unit is arranged for at least computing transition metrics of the first encoded soft input; and
- a log-likelihood ratio (LLR) computation unit, wherein during the first time period, the LLR computation unit is arranged for generating a decoded soft output of the first encoded soft input according to the transition metrics, the first metrics and the second metrics of the first code segment.

9. A decoding method comprising:
enabling a plurality of decoder cores in a turbo decoder; and
configuring each of the plurality of decoder cores to decode a different corresponding code segment according to a sliding window, and sequentially generate a plurality of decoded soft outputs each derived from decoding an encoded soft input selected from the corresponding code segment by the sliding window;
wherein in a same iteration, adjacent decoder cores of the plurality of decoder cores are arranged to obtain different metrics in opposite decoding directions respectively, and in adjacent iterations, one of the plurality of decoder cores is arranged to obtain different metrics in opposite decoding directions.

10. The decoding method of claim 9, wherein the plurality of decoder cores are arranged for parallel decoding of a plurality of code segments of a code block in one iteration.

11. The decoding method of claim 9, wherein the step of configuring each of the plurality of decoder cores to decode the corresponding code segment comprises:
in a first iteration, configuring a first decoder core of the plurality of decoder cores to obtain first metrics of a first code segment in a first decoding direction according to a full trace manner, and obtain second metrics of the first code segment in a second decoding direction according to a partial trace manner, where the second decoding direction is opposite to the first decoding direction.

12. The decoding method of claim 10, wherein the step of configuring each of the plurality of decoder cores to decode the corresponding code segment further comprises:
in a second iteration following the first iteration, configuring the first decoder core to obtain first metrics of the first code segment in the first decoding direction according to the partial trace manner, and obtain second metrics of the first code segment in the second decoding direction according to the full trace manner.

13. The decoding method of claim 10, wherein the first code segment and a second code segment are successive code segments in a code block; and the step of configuring each of the plurality of decoder cores to decode the corresponding code segment further comprises:
in the first iteration, configuring a second decoder core of the plurality of decoder cores to obtain first metrics of the second code segment in the first decoding direction according to a partial trace manner, and obtain second metrics of the second code segment in the second decoding direction according to the full trace manner.

14. The decoding method of claim 10, wherein the turbo decoder has a plurality of pre-defined decoder cores, and the decoding method further comprises:
referring to a throughput requirement to adaptively enable part or all of the pre-defined decoder cores as the plurality of decoder cores for decoding a code block.

15. The decoding method of claim 10, wherein a first encoded soft input, a second encoded soft input and a third encoded soft input are successively selected from the corresponding code segment by the sliding window; and the step of configuring each of the plurality of decoder cores to decode the corresponding code segment comprises:
during a first time period, computing first metrics of the second encoded soft input in a first decoding direction according to a full trace manner, computing second metrics of the first encoded soft input in a second decoding direction opposite to the first decoding direction according to a partial trace manner, and computing second metrics of the third encoded soft input in the second decoding direction according to the partial trace manner.

16. The decoding method of claim 15, wherein the step of configuring each of the plurality of decoder cores to decode the corresponding code segment further comprises:
during a second time period preceding the first time period, computing first metrics of the first encoded soft input in the first decoding direction according to the full trace manner;
during the first time period, at least computing transition metrics of the first encoded soft input; and
during the first time period, generating a decoded soft output of the first encoded soft input according to the transition metrics, the first metrics and the second metrics of the first code segment.

17. A turbo decoder comprising:
a plurality of decoder cores, each arranged to decode a different corresponding code segment according to a sliding window, and sequentially generate a plurality of decoded soft outputs each derived from decoding an encoded soft input selected from the corresponding code segment by the sliding window, wherein in a same iteration, adjacent decoder cores of the plurality of decoder cores are arranged to obtain different metrics in opposite decoding directions respectively, and in adjacent iterations, one of the plurality of decoder cores is arranged to obtain different metrics in opposite decoding directions; and
a controller, arranged for referring to a throughput requirement to adaptively enable part or all of the pre-defined decoder cores to decode a code block in an iteration.

18. A decoding method comprising:
providing a plurality of decoder cores, each arranged to decode a different corresponding code segment according to a sliding window, and sequentially generate a plurality of decoded soft outputs each derived from decoding an encoded soft input selected from the corresponding code segment by the sliding window, wherein in a same iteration, adjacent decoder cores of the plurality of decoder cores are arranged to obtain different metrics in opposite decoding directions respectively, and in adjacent iterations, one of the plurality of decoder cores is arranged to obtain different metrics in opposite decoding directions; and referring to a throughput requirement to adaptively enable part or all of the pre-defined decoder cores to decode a code block in an iteration.

* * * * *